(12) United States Patent
Poiesz et al.

(10) Patent No.: US 10,453,734 B2
(45) Date of Patent: Oct. 22, 2019

(54) SUBSTRATE HOLDER, A LITHOGRAPHIC APPARATUS AND METHOD OF MANUFACTURING DEVICES

(71) Applicant: ASML Netherlands B.V., Veldhoven (NL)

(72) Inventors: Thomas Poiesz, Veldhoven (NL); Martijn Houben, 's-Hertogenbosch (NL); Abraham Alexander Soethoudt, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/580,601

(22) PCT Filed: Jun. 1, 2016

(86) PCT No.: PCT/EP2016/062371
§ 371 (c)(1),
(2) Date: Dec. 7, 2017

(87) PCT Pub. No.: WO2017/001135
PCT Pub. Date: Jan. 5, 2017

(65) Prior Publication Data
US 2018/0190534 A1 Jul. 5, 2018

(30) Foreign Application Priority Data
Jul. 2, 2015 (EP) .................... 15175082

(51) Int. Cl.
*G03B 27/52* (2006.01)
*H01L 21/687* (2006.01)
(Continued)

(52) U.S. Cl.
CPC .......... *H01L 21/6875* (2013.01); *B23H 7/26* (2013.01); *G03F 7/2002* (2013.01);
(Continued)

(58) Field of Classification Search
CPC ...... G03F 7/2002; G03F 7/2004; G03F 7/707; G03F 7/70783
See application file for complete search history.

(56) References Cited

U.S. PATENT DOCUMENTS 6,151,794 A 11/2000 Wu
6,307,620 B1 10/2001 Takabayashi et al.
(Continued)

FOREIGN PATENT DOCUMENTS

EP 1326139 7/2003
JP 57-149731 9/1982
(Continued)

OTHER PUBLICATIONS

International Search Report and Written Opinion dated Jul. 29, 2016 in corresponding International Patent Application No. PCT/EP2016/062371.

(Continued)

*Primary Examiner* — Peter B Kim
(74) *Attorney, Agent, or Firm* — Pillsbury Winthrop Shaw Pittman LLP (57) ABSTRACT

A substrate holder for use in a lithographic apparatus and configured to support a substrate, the substrate holder including: a main body having a main body surface; and a plurality of burls projecting from the main body surface; wherein each burl has a distal end configured to engage with the substrate; the distal ends of the burls substantially conform to a support plane whereby a substrate can be supported in a substantially flat state on the burls; a frictional force between the distal end of each burl and a substrate engaged therewith arises in a direction parallel to the support plane in the event of a relative movement of the substrate and substrate holder in the direction; and distal end surfaces of the burls are provided with a release structure configured (Continued)

so that the frictional force is less than would arise in the absence of the release structure.

20 Claims, 6 Drawing Sheets

(51) Int. Cl.
    *G03F 7/20*     (2006.01)
    *B23H 7/26*     (2006.01)
    *H01L 21/027*     (2006.01)
    *H01L 21/683*     (2006.01)

(52) U.S. Cl.
CPC ............ *G03F 7/2004* (2013.01); *G03F 7/707* (2013.01); *G03F 7/70783* (2013.01); *H01L 21/0274* (2013.01); *H01L 21/6831* (2013.01); *H01L 21/6838* (2013.01)

(56) References Cited

U.S. PATENT DOCUMENTS

| | | |
|---|---|---|
| 7,791,708 B2 | 9/2010 | Puyt et al. |
| 8,208,118 B2 | 6/2012 | Burry et al. |
| 8,724,081 B2 | 5/2014 | De Vries et al. |
| 8,792,085 B2 | 7/2014 | Puyt et al. |
| 9,507,274 B2 | 11/2016 | Lafarre et al. |
| 2002/0175160 A1 | 11/2002 | Bagley et al. |
| 2003/0176079 A1 | 9/2003 | Sogard |
| 2004/0200226 A1 | 10/2004 | Hara et al. |
| 2004/0248430 A1 | 12/2004 | Barber et al. |
| 2008/0158538 A1 | 7/2008 | Puyt et al. |
| 2009/0201473 A1 | 8/2009 | Burry et al. |
| 2010/0142114 A1 | 6/2010 | Purohit et al. |
| 2010/0270004 A1 | 10/2010 | Landess et al. |
| 2010/0296073 A1 | 11/2010 | Puyt et al. |
| 2011/0205516 A1 | 8/2011 | De Vries et al. |
| 2013/0152604 A1 | 6/2013 | Mimata et al. |
| 2013/0175005 A1 | 7/2013 | Gowdaru et al. |
| 2013/0201597 A1* | 8/2013 | Ishikawa ............. H01L 21/6833 361/234 |
| 2014/0105582 A1 | 4/2014 | Tallavarjula et al. |
| 2015/0029485 A1 | 1/2015 | Lafarre et al. |

FOREIGN PATENT DOCUMENTS

| | | |
|---|---|---|
| JP | 63-187619 | 8/1988 |
| JP | 2001341043 | 12/2001 |
| JP | 2007527625 | 9/2007 |
| JP | 2009-054723 | 3/2009 |
| JP | 2010097961 | 4/2010 |
| JP | 2010515258 | 5/2010 |
| JP | 2012009720 | 1/2012 |
| JP | 2012069775 | 4/2012 |
| JP | 2012079829 | 4/2012 |
| JP | 2012511832 | 5/2012 |
| WO | 2008/156366 | 12/2008 |
| WO | 2014/122151 | 8/2014 |

OTHER PUBLICATIONS

Japanese Office Action issued in corresponding Japanese Patent Application No. 2017-562073, dated Dec. 27, 2018.

* cited by examiner

SUBSTRATE HOLDER, A LITHOGRAPHIC APPARATUS AND METHOD OF MANUFACTURING DEVICES

CROSS REFERENCE TO RELATED APPLICATIONS

This application is the U.S. national phase entry of PCT patent application no. PCT/EP2016/062371, which was filed on Jun. 1, 2016, which claims priority of European patent application no. 15175082.5, which was filed on Jul. 2, 2015, and which is incorporated herein in its entirety by reference.

FIELD

The present invention relates to a substrate holder, a lithographic apparatus using the substrate holder, and a method of making devices using the substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It is desirable that when a substrate is first loaded onto a substrate holder in preparation for exposure it is held freely so that any stresses can be released. During the loading process, the substrate is supported by so-called e-pins which hold it at three positions. Therefore, the weight of the substrate causes it to distort and it is desirable that this distortion be released before exposures. On the other hand, it is desirable that the substrate be held very firmly during exposure. There are two reasons for this. Firstly, the substrate is subjected to very large accelerations during an exposure sequence in order to achieve a high throughput and must not move on the substrate holder. Secondly, the substrate absorbs energy from the projection beam during exposure and therefore heats up locally. Such local heating can cause thermal expansion and distortion of the substrate. By holding the substrate firmly to the substrate holder such distortion can be resisted.

A substrate holder conventionally has a plurality of burls to support the substrate. The total area of the burls that contacts the substrate is small compared to the total area of a substrate. Therefore, the chance that a contaminant particle randomly located on the surface of the substrate or the substrate holder is trapped between a burl and the substrate is small. Also, in manufacture of the substrate holder, the tops of the burls can be made more accurately coplanar, than a large surface can be made accurately flat.

The substrate is conventionally clamped to the substrate holder during exposures. Two clamping techniques are commonly used. In vacuum-clamping a pressure differential across the substrate is established, e.g., by connecting the space between the substrate holder and the substrate to an under-pressure that is lower than a higher pressure above the substrate. The pressure difference gives rise to a force holding the substrate to the substrate holder. In electrostatic clamping, electrostatic forces are used to exert a force between the substrate and the substrate holder. Several different arrangements are known to achieve this. In one arrangement a first electrode is provide on the lower surface of the substrate and a second electrode on the upper surface of the substrate holder. A potential difference is established between the first and second electrodes. In another arrangement two semi-circular electrodes are provided on the substrate holder and a conductive layer is provided on the substrate. A potential difference is applied between the two semi-circular electrodes so that the two semi-circular electrodes and the conductive layer on the substrate act like two capacitors in series.

SUMMARY

It is desirable, for example, to provide an improved substrate holder that can better meet the conflicting requirements of releasing stress during loading and holding the substrate firmly during exposures.

According to an aspect of the invention, there is provided a substrate holder for use in a lithographic apparatus and configured to support a substrate, the substrate holder comprising:
    a main body having a main body surface; and
    a plurality of burls projecting from the main body surface; wherein
    each burl has a distal end configured to engage with the substrate;
    the distal ends of the burls substantially conform to a support plane whereby a substrate can be supported in a substantially flat state on the burls;
    a frictional force between the distal end of each burl and a substrate engaged therewith arises in a direction parallel to the support plane, e.g., in the event of a relative movement of the substrate and substrate holder in the direction; and
    distal end surfaces of the burls are provided with a release structure configured so that the frictional force is less than would arise in the absence of the release structure.

According to an aspect of the invention, there is provided a lithographic apparatus for projecting an image onto a substrate, the lithographic apparatus comprising:
    a substrate holder as described above; and
    a clamp system for clamping a substrate to the substrate holder According to an aspect of the invention, there is provided a method of manufacturing devices using a lithographic apparatus having a substrate holder as described above and a clamp system for clamping a substrate to the substrate holder, the method comprising:
    loading a substrate onto the substrate holder;
    allowing a deformation of the substrate to relax;
    engaging the clamp system; and
    exposing a pattern onto the substrate.

According to an aspect of the invention, there is provided a method of manufacturing a substrate holder, the method comprising:

providing a substrate holder blank;

removing material from the substrate holder blank to define a plurality of burls projecting from a main body surface;

processing the burls to form burl distal ends configured to engage with the substrate and that substantially conform to a support plane whereby a substrate can be supported in a substantially flat state on the burls; and providing a release structure on the distal ends of each burl, the release structure configured to reduce a frictional force between the distal end of each burl and a substrate engaged therewith that arises in a direction parallel to the support plane, e.g., in the event of a relative movement of the substrate and substrate holder in the direction compared to a case where the release structure is absent.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
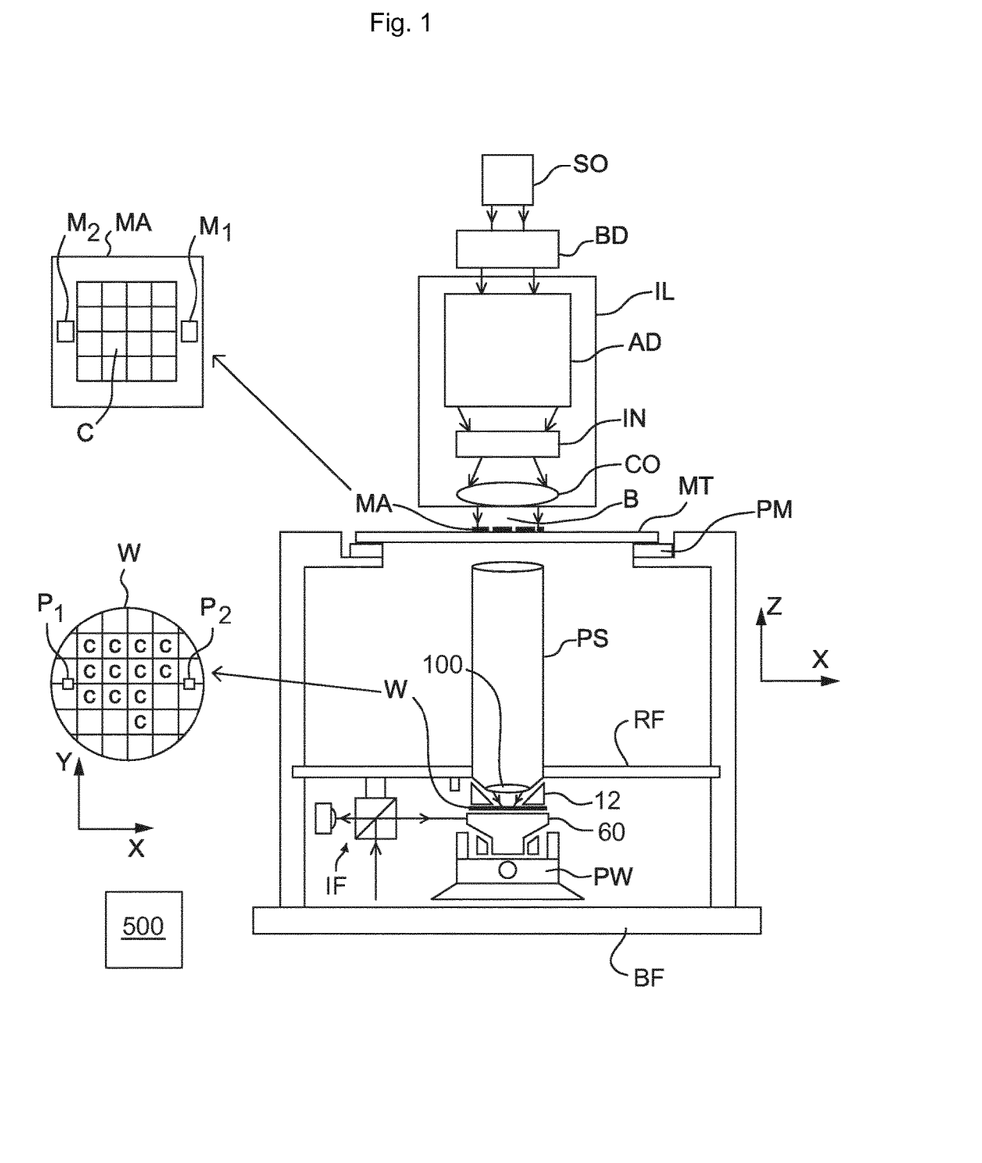
FIG. 1 schematically depicts a lithographic apparatus.

FIG. 1 schematically depicts a lithographic apparatus of an embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate support apparatus 60 constructed to hold a substrate (e.g. a resist-coated production substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables. The lithographic apparatus may be of a type that has a measurement station, at which there are various sensors for characterizing a production substrate prior to exposure and an exposure station, at which the exposures are commanded out.

The lithographic apparatus is of a type wherein at least a portion of the substrate W may be covered by a immersion liquid 10 having a relatively high refractive index, e.g. water such as ultra pure water (UPW), so as to fill an immersion space 11 between the projection system PS and the substrate W. An immersion liquid 10 may also be applied to other spaces in the lithography apparatus, for example, between the patterning device MA and the projection system PS Immersion techniques can be used to increase the numerical aperture of projection systems. The term "immersion" as used herein does not mean that a structure, such as a substrate W, must be submerged in immersion liquid 10; rather "immersion" only means that an immersion liquid 10 is located between the projection system PS and the substrate W during exposure. The path of the patterned radiation beam B from the projection system PS to the substrate W is entirely through immersion liquid 10.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW.

In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the patterning device alignment marks M1, M2 may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam B is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

Arrangements for providing immersion liquid between a final optical element of the projection system PS and the substrate W can be classed into three general categories. These are the bath type arrangement, the so-called localized immersion systems and the all-wet immersion systems. An embodiment of the present invention relates particularly to the localized immersion systems.

In an arrangement which has been proposed for a localized immersion system a liquid confinement structure 12 extends along at least a part of a boundary of an immersion space 11 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, substrate table WT which surrounds the substrate W or both.

The liquid confinement structure 12 at least partly contains immersion liquid 10 in the immersion space 11 between the final optical element of the projection system PS and the substrate W and/or substrate support apparatus 60. The immersion space 11 is at least partly formed by the liquid confinement structure 12 positioned below and surrounding the final optical element of the projection system PS.

To load a substrate onto the substrate support apparatus 60 for exposures, it is picked up by a substrate handler robot and lowered onto a set of e-pins which project through the substrate holder. The e-pins are actuated so that they can extended and retract and may be provided with suction openings at their tips to grip the substrate. They may be three e-pins spaced around the center of the substrate holder. Once the substrate has settled on the e-pins, the e-pins are retracted so that the substrate is supported by burls of the substrate holder. While the substrate is being held by the e-pins, its own weight will cause it to distort, e.g. becoming convex when viewed from above. As the substrate is lowered onto the burls of the substrate it will contact in some places, e.g. near the edge, before other places, e.g. near the center, and friction between the burls and the lower surface of the substrate may prevent the substrate fully relaxing into a flat unstressed state.

Although the curvature of the substrate when supported on the e-pins is small—due to the rigidity of the substrate— and some relaxation does occur when the substrate is on the burls of the substrate holder, the residual curvature can nonetheless be sufficient to cause undesirable overlay errors. Friction between the burls and the substrate is necessary firstly to ensure that the substrate is held in place securely during the high accelerations that are necessary during the exposure processes to achieve high throughput and secondly to resist thermal expansion of the wafer due to absorption of energy from the radiation beam B. Thus there are conflicting requirements for the interface between the substrate and the substrate holder: it must be low friction to allow the substrate to fully relax when it is first placed on the substrate holder but high friction to hold the substrate securely during exposure.

According to the present invention there is proposed a substrate holder for use in a lithographic apparatus and configured to support a substrate, the substrate holder comprising: a main body having a main body surface; and a plurality of burls projecting from the main body surface; wherein each burl has a distal end configured to engage with the substrate; the distal ends of the burls substantially conform to a support plane whereby a substrate can be supported in a substantially flat state on the burls; a frictional force between the distal end of each burl and a substrate engaged therewith arises in a direction parallel to the support plane; and distal end surfaces of the burls are provided with a release structure configured so that the frictional force is less than would arise in the absence of the release structure.

The release structure reduces friction in directions parallel to the support plane, i.e. the surface of the substrate, to allow the substrate to fully relax when placed on the substrate holder. This can be detrimental to performance during exposures but if so the clamping force exerted by a clamp can be increased to compensate.

In an embodiment, the release structure comprises a layer of diamond-like carbon applied to the distal end surfaces of the burls. The layer of diamond-like carbon can reduce the coefficient of friction between the burls and the substrate by a factor of about 2 compared to burls made of SiSiC. In an embodiment, the release structure comprises a layer of boron nitride (BN) or $\beta$-$C_3N_4$.

In an embodiment, the layer of diamond-like carbon has a thickness of greater than about 1 µm. Such a thickness allows the layer of diamond-like carbon to be processed after deposition to increase flatness of the burl surface and ensure that the distal ends of the burls accurately conform to the support plane. However, the thickness can be as low as 50 nm, especially if the burl heights are sufficiently accurate that post processing is not necessary.

In an embodiment, the layer of diamond-like carbon has a thickness of less than about 2 µm. Such a thickness ensures that the layer of diamond-like carbon does not generate additional stress in the substrate holder due to the manufacturing process.

In an embodiment, the layer of diamond-like carbon comprises at least one additive selected from the group consisting of Si, N, Mo and Fl. Additives to the layer of diamond-like carbon can be used to optimize its properties. For example Si can improve adhesion to the SiSiC material of the substrate holder. Fl can further reduce the friction between the substrate and substrate holder.

In an embodiment, the release structure comprises a recess in the distal end surface of each burl. The recess reduces the surface area of the distal end of the burl that contacts the substrate and so reduces the friction when the substrate is first placed on the substrate holder. However, when a clamping force is applied the substrate and burl locally distort to increase the area of contact and increase friction.

In an embodiment, the release structure comprises both a layer of diamond-like carbon and a recess. Such a release structure combines the advantages of both types of structure and has additional advantages in manufacture.

In an embodiment, the recess has an area in the range of from ¼ to ¾ of the total area of the distal end surface. A recess having an area greater than ¼ of the total are of the distal end of the burl can provide a useful reduction in friction. A recess having an area less than ¾ of the total are of the distal end surface of the burl can provide sufficient robustness to the distal end of the burl.

In an embodiment, the recess has a depth in the range of from 10 nm to 40 nm. If the recess has a depth in this range it can be ensured that the contact area increases sufficiently when a reasonable clamping force is applied.

In an embodiment, the recess has a shape in plan selected from the group consisting of circles, squares, ovals, stars, crosses. Recesses of such shapes can be manufactured conveniently and provide the desired effects.

In an embodiment, the distal end surface comprises a continuous ring surrounding the recess. Such a structure can ensure sufficient robustness to the distal end of the burl.

In an embodiment, a part of the recess extends to a peripheral edge of the distal end surface. Such a structure can provide a path for gas in the recess to escape when the clamping force is engaged and the substrate and burl distort.

The present invention also provides a lithographic apparatus for projecting an image onto a substrate, the lithographic apparatus comprising: a substrate holder as described above; and a clamp system for clamping a substrate to the substrate holder.

In an embodiment, the clamp system is configured to exert a clamping force urging the substrate toward the substrate holder, the clamping force being sufficiently strong that the substrate contacts the burl in the area of the recess when the clamping force is in effect.

The present invention also provides a method of manufacturing devices using a lithographic apparatus having a substrate holder as described above and a clamp system for clamping a substrate to the substrate holder, the method comprising: loading a substrate onto the substrate holder; allowing a deformation of the substrate to relax; engaging the clamp system; and exposing a pattern onto the substrate.

By allowing the deformation of the substrate to relax before engaging the clamp, overlay errors can be minimized; the release structure allows the relaxation to occur without any delay.

The present invention provides a method of manufacturing a substrate holder, the method comprising: providing a substrate holder blank; removing material from the substrate holder blank to define a plurality of burls projecting from a main body surface; processing the burls to form burl distal end surfaces that substantially conform to a support plane whereby a substrate can be supported in a substantially flat state on the burls; providing a release structure configured to reduce forces parallel to the support plane between a substrate and the burl.

In an embodiment, providing a release structure comprises providing a layer of diamond-like carbon on the distal end surfaces.

In an embodiment, providing a release structure further comprises forming a recess in the layer of diamond-like carbon. The layer of diamond-like carbon is homogeneous—whereas the burl material, e.g. SiSiC, may not be—allowing reliable formation of the recess.

In an embodiment, providing a release structure comprises forming a recess in the distal end surfaces.

Figure 2:
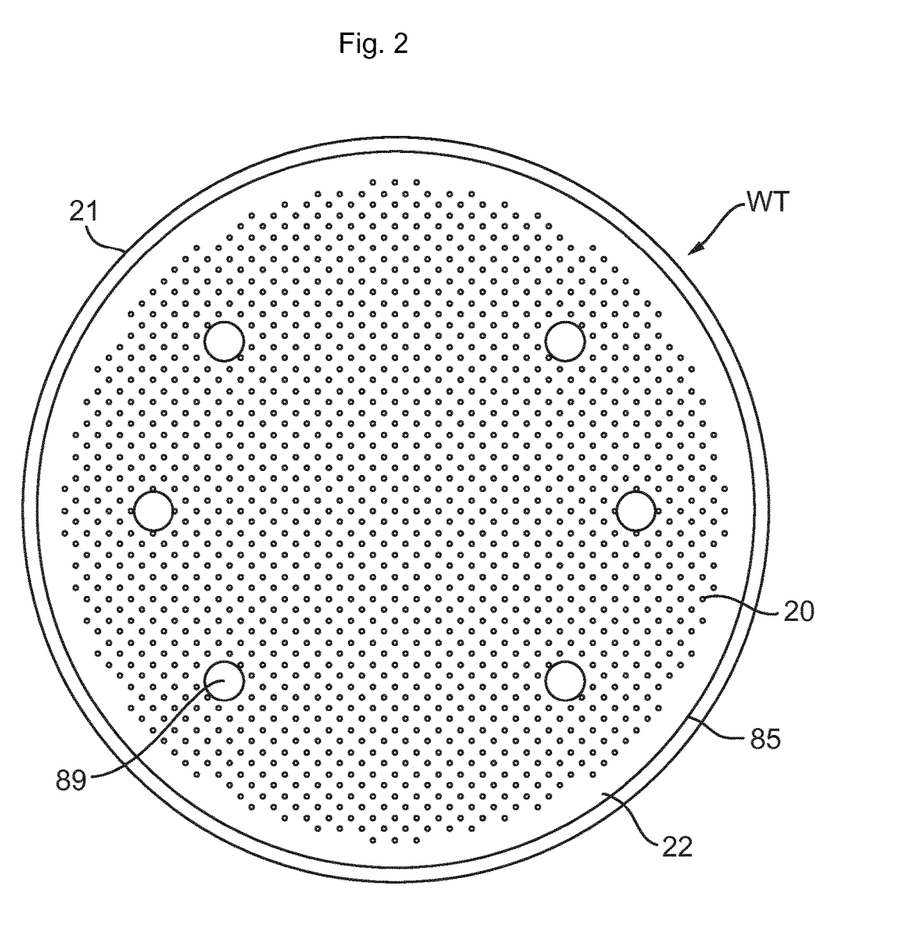
FIG. 2 depicts in plan a substrate holder according to an embodiment.

FIG. 2 depicts a substrate holder WT forming part of substrate support apparatus 60. Substrate holder WT comprises a main body 21 having a main body upper surface 22 and a plurality of burls 20 projecting from the main body upper surface 22. A substrate can be supported by the distal end surfaces of burls 20, which conform to a substantially flat support plane to support the substrate in a flat state. Main body 21 and burls 20 may be formed of SiSiC, a ceramic material having silicon carbide (SiC) grains in a silicon matrix.

A plurality of through-holes 89 are formed in the main body. Through-holes 89 allow the e-pins to project through the substrate holder WT to receive the substrate W and allow the space between a substrate W and the substrate holder WT to be evacuated. Evacuation of the space between a substrate and the substrate holder can provide a clamping force to hold the substrate in place if the space above the substrate is not also evacuated, as would be the case in a lithographic apparatus using EUV radiation. In a lithographic apparatus using EUV radiation, electrodes can be provided on the substrate holder WT to form an electrostatic clamp.

Other structures, e.g. to control gas flow and/or thermal conductivity between the substrate holder WT and the substrate W, can be provided. An edge seal 85 is provided near the periphery of substrate holder WT. Edge seal 85 is a projecting ridge around the outside of substrate holder WT. It has a height slightly shorter than that of the burls 20 so that it does not contact the substrate W but reduces the gas flow into the space between the substrate W and substrate holder WT so as to improve vacuum clamping. The substrate holder can also be provided with electronic components, e.g. heaters and sensors, to control the temperature of the substrate holder WT and substrate W.

Figure 3:
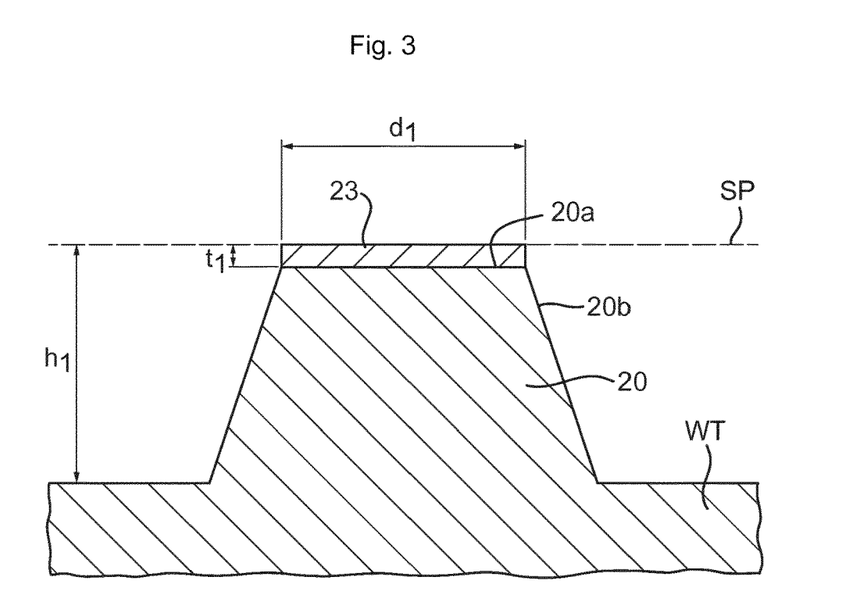
FIG. 3 depicts in cross-section a burl of a substrate holder according to an embodiment.

A burl 20 is shown enlarged in FIG. 3. In an embodiment, burl 20 has a height $h_1$ in the range of from 100 μm to 500 μm, e.g. about 150 μm. The diameter $d_1$ of the distal end surface 20a of burl 20 may be in the range of 100 μm to 300 μm, e.g. about 200 μm. The pitch of the burls, i.e. the distance between the centers of two adjacent burls, may be in the range of about 0.5 mm to 3 mm, e.g. about 1.5 mm. In an embodiment, the total area of the distal end surfaces 20a of all the burls 20 is in the range of from 1% to 3% of the total area of a substrate W or the substrate holder WT. Indicated in FIG. 3, burls 20 may be frusto-conical in shape, with side walls 20b being slightly inclined. In an embodiment, the side walls 20b may be vertical or even overhanging if that is more convenient to manufacture. In an embodiment burls 20 are circular in plan. Burls 20 can also be formed in other shapes if desired.

In an embodiment, a layer of diamond-like carbon 23 is provided on distal end surface 20a of burl 20 to form a release structure. The layer of diamond-like carbon 23 has a thickness $t_1$ in the range of from 50 nm to 2 μm, desirably in the range of from 1 μm to 2 μm. A thickness of greater than 1 μm allows for the thickness of the layer of diamond-like carbon 23 to be adjusted after it has been deposited in order to ensure that the upper surface of the layer of diamond-like carbon 23 accurately conforms to the support plane SP. A thickness of less than 2 μm ensures that the deposition of the layer of diamond-like carbon 23 does not create additional stress in the substrate holder WT. Any additional stress in the substrate holder WT might distort it.

The exact formulation of the layer of diamond-like carbon 23 can be selected to achieve desired properties, e.g. adhesion to the material of the main body 21, mechanical strength, robustness and coefficient of friction to the substrate W. Suitable additives that can be included in the layer of diamond-like carbon 23 include silicon, nitrogen, molybdenum and fluorine. If the main body 21 of substrate holder WT and burls 20 are formed of SiSiC then inclusion of silicon in the layer of diamond-like carbon 23 can improve adhesion to the distal end surface 20a of the burl. In an embodiment, an adhesion promoting layer can be provided between distal end surface 20a and the layer of diamond-like carbon 23. Addition of fluorine to the layer of diamond-like carbon 23 can further reduce friction.

In an embodiment of the present invention, the layer of diamond-like carbon 23 reduces the friction between the substrate holder WT and a substrate by a factor of about 2 compared to a substrate holder WT of SiSiC without the layer of diamond-like carbon 23 but otherwise similar in all respects. In an embodiment of the present invention, the coefficient of friction, defined as a ratio of normal force to pulling force, can be about 0.1. The coefficient of friction can be measured by placing a piece of substrate on the substrate table and measuring the force required to drag it across the substrate table. The normal force is desirably of the order of mN and can be provided through the weight of the piece of substrate, additional weights placed on top or a pressure difference across it. The ambient humidity can have an effect on measurement of the coefficient friction so the measurement is desirably performed with relative humidity RH in the range of from 30° to 70°.

An additional advantage of the layer of diamond-like carbon 23 of the present invention is that it is stiffer than SiSiC. In an embodiment of the present invention, the layer of diamond-like carbon 23 has a stiffness about 60% greater than pure SiSiC. This increased stiffness can help suppress thermal deformation of the substrate W.

Figure 4:
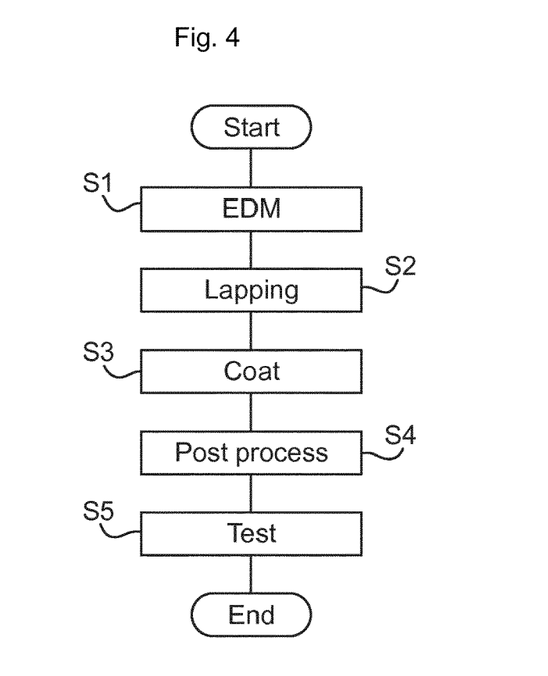
FIG. 4 depicts a method of manufacturing a substrate holder according to an embodiment.

FIG. 4 depicts a method of manufacturing a substrate holder WT according to an embodiment of the present invention. A blank, e.g. made of SiSiC, of the appropriate diameter and thickness is machined S1 by electric discharge machining to form the burls 20 and other structures on the surface of substrate holder WT. Then, a lapping process S2 is preformed to correct the heights of the burls 20 to a greater level of accuracy than is possible using electric discharge machining. The surface roughness of the distal end surfaces 20a of the burls 20 is also improved by the lapping process. Next the layer of diamond-like carbon 23 is coated S3 on the distal end surfaces 20a of the burls 20. In an embodiment, the layer of diamond-like carbon 23 is coated through a mask so that the coating is applied only to the distal end surfaces 20a and not the side surfaces 20b of the burls 20. In an embodiment, the layer of diamond-like carbon 23 is initially provided to the whole of substrate table WT and subsequently removed from the side surfaces 20b of burls 20 and the main body upper surface 22.

After the layer of diamond-like carbon 23 has been applied to the burls 20, a post processing step S4 is applied to ensure that the upper surface of the layer of diamond-like carbon 23 has a desired flatness and confirms accurately to the support plane SP. The post processing step S3 involves selective removal of material, e.g. by laser ablation. After the post processing, the substrate holder WT is tested S5 and may be reworked if necessary.

Figure 5:
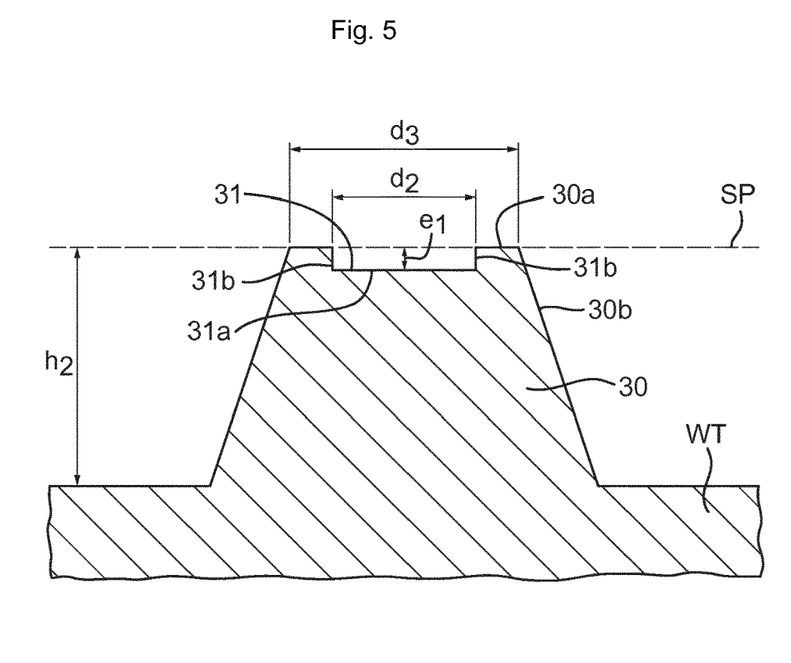
FIG. 5 depicts in cross-section a burl of a substrate holder according to an embodiment.
Figure 6:
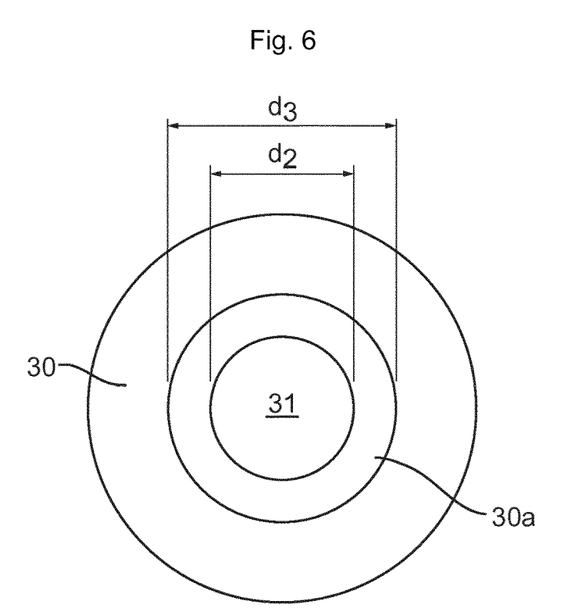
FIG. 6 depicts in plan the burl of FIG. 5 according to an embodiment.

FIG. 5 depicts in cross section a burl 30 according to an embodiment of the present invention. FIG. 6 depicts burl 30 in plan view from above. Burl 30 has overall dimensions, e.g. height $h_2$ and diameter $d_3$ of its distal end surface 30a, that are similar to the corresponding dimensions of burl 20. As with burl 20, the side surfaces 30b of burl 30 may be inclined so that the overall shape of burl 30 is frusto-conical.

Burl 30 differs from burl 20 in having a recess 31 in its distal end surface 30a to form a release structure. Recess 31 has a depth $e_1$ in the range of from 10 nm to 40 nm, e.g. about 20 nm. Recess 31 has a diameter $d_2$ in the range of from about 50% to about 90% of the overall diameter $d_3$ of the distal end surface of 30a of burl 30. In an embodiment, the area of the recess 31 is in the range of from about ¼ to about ¾ of the overall area of distal end surface 30a.

Although FIG. 5 depicts recess 31 as being cylindrical, it need not be exactly cylindrical. Recess side walls 31b may be inclined inwardly or outwardly and recess bottom surface 31a need not be flat. For example, recess bottom surface 31a may be concave when viewed from above. In the event that recess 31 is not cylindrical, its diameter should be taken as the largest diameter in the plane SP and its area should likewise be measured in the plane SP. Its depth $e_1$ should be measured at the point which is furthest from the plane SP.

Figure 7:
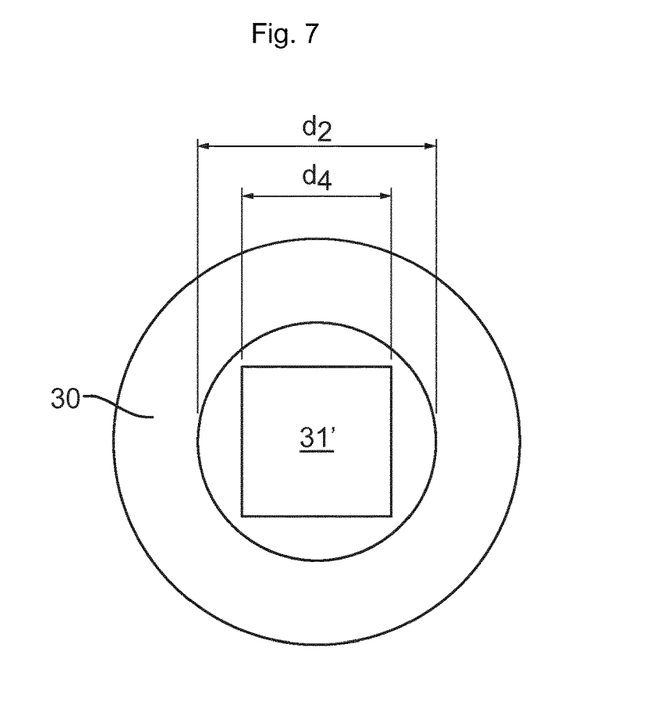
FIG. 7 depicts in plan a burl of another substrate holder according to an embodiment.

The recess 31 in the distal end surface 30a of burl 30 need not be circular in plan but can take any convenient form e.g. square as indicated in FIG. 7, oval or star shape. In the case of a non circular recess 31', it is desirable that the area of the recess be in the range of from ¼ to ¾ of the total area of the distal end surface 30a whilst the diameter $d_4$ need not fall within the range specified above. In an embodiment, the shape of the recess is determined as is most convenient for the selected method of manufacture.

Figure 8:
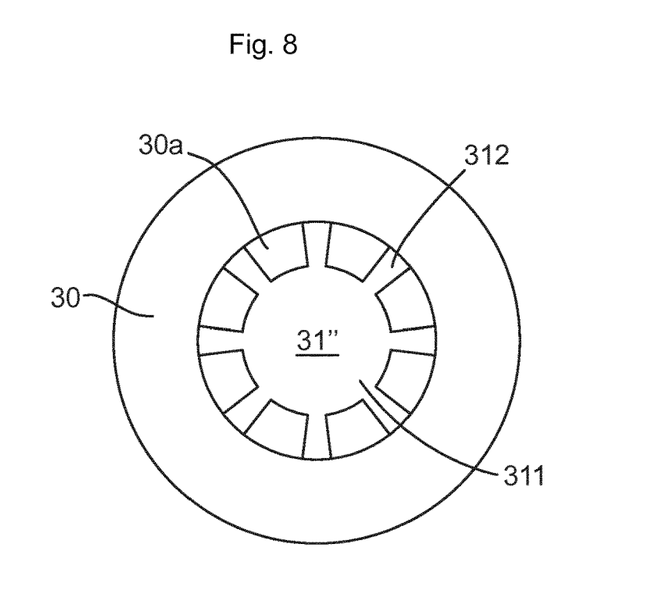
FIG. 8 depicts in plan a burl of another substrate holder according to an embodiment.

In an embodiment, illustrated in FIG. 8, recess 31" includes a main recess part 311 and a plurality of channels 312 which lead from the main recess part 311 to the edge of the distal end surface 30a. The channel 312 allow gas that might be located within recess 31" to escape.

Figure 9:
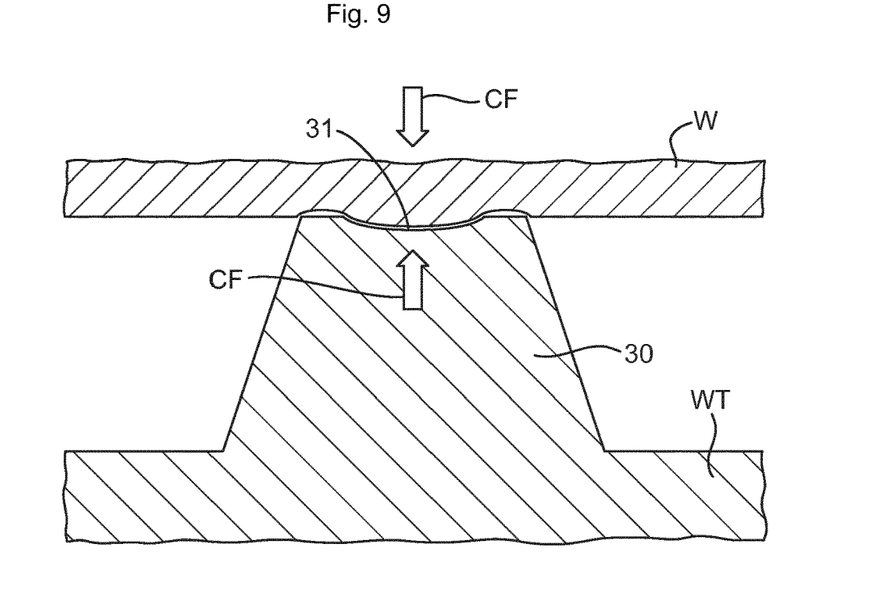
FIG. 9 depicts in cross-section a substrate loaded on a substrate holder according to an embodiment.

FIG. 9 illustrates the effect of the recess 31 when a substrate W is held on the substrate table WT by a clamping force CF. A clamping force CF can be applied by a vacuum clamp or an electrostatic clamp as described above. As illustrated in FIG. 9, the clamping force causes local distortion of substrate W and the distal end of burl 30 so that the total area of contact between substrate W and substrate holder WT increases. Therefore, the friction between substrate W and substrate holder WT similarly increases. The amount of contact between substrate W and substrate holder WT when the clamping force is applied depends upon various properties of the substrate W and substrate holder WT, including the shape and depth of the recess 31 as well as the magnitude of the clamping force.

In an embodiment, the clamping force is sufficient that the area of contact per burl between substrate W and substrate holder WT when the clamping force is applied is substantially equal to the total area of the distal end surface 30a. In this way, a substantial frictional force sufficient to hold the substrate in place during the exposures and resist thermal deformation thereof can be achieved. Prior to the application of the clamping force, the area of contact per burl between substrate W and substrate holder WT is limited to the area of distal end surface 30a excluding the recess 31. Thus, a substantially reduced frictional force is present prior to application of the clamping force and substrate W can relax fully from any distortion arising from its handling.

Figure 10:
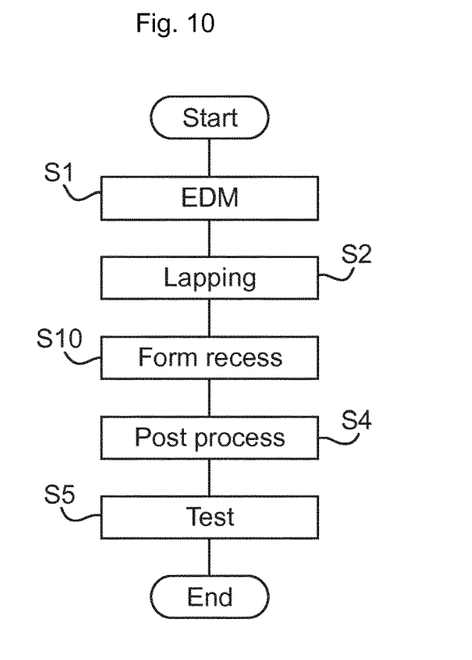
FIG. 10 depicts a method of manufacturing a substrate holder according to an embodiment.

FIG. 10 depicts a method according to an embodiment of the present invention. The initial steps of electrical discharge machining S1 and lapping S2 are the same as in the method of FIG. 4. Then, the recesses are formed in the distal end surfaces of the burls, e.g. by laser ablation. The recesses can be also formed by electrical discharge machining or by etching through a mask. The mask may be defined lithographically. Thereafter the same post processing step S4 and testing step S5 as in FIG. 4 are performed.

It will be appreciated that the above described embodiments of the present invention can be combined, in other words the release structure may be formed as a combination of a layer of diamond-like carbon and a recess. Such a combined release structure can be formed by first forming the recess and then applying the layer of diamond-like carbon or vice-versa. If the layer of diamond-like carbon is applied first, it can make formation of the recess easier. The diamond-like carbon layer is homogeneous and therefore can be processed more easily. If the substrate holder WT and in particular its burls 30 are manufactured of a material such as SiSiC, which comprises grains in a matrix, it can be more difficult to manufacture recesses of consistent size and shape.

In an embodiment of the present invention it is desirable that all burls of the substrate holder WT are provided with the same release structure. However, it is possible that the release structure is provided only to certain burls, e.g. burls in a central region of the substrate holder. It is also possible that different release structures are applied to some burls. Having all burls with the same release structure ensures a more uniform stiffness to the burls and hence reduces the likelihood of an unflatness being introduced by variations in stiffness. Providing no release structure on burls near the periphery of the substrate holder WT can improve the lifetime of the substrate holder WT since the outermost burls are most subjected to wear and burls without a release structure are more likely to resist wear.

An embodiment of the invention can be applied to a support structure MT for a patterning device MA, e.g. a mask. On loading of a patterning device MA onto a support structure, distortion can occur and so the same desire to release any distortion as described above applies. Also, the patterning device MA must be held securely during exposures in the same way as the substrate. It should be noted however that a transmissive mask is only held around its periphery and the support structure has an aperture for passage of the radiation beam.

In an embodiment, there is provided a substrate holder for use in a lithographic apparatus and configured to support a substrate, the substrate holder comprising: a main body having a main body surface; and a plurality of burls projecting from the main body surface; wherein each burl has a distal end configured to engage with the substrate; the distal ends of the burls substantially conform to a support plane and are configured for supporting a substrate; a frictional force between the distal end of each burl and a substrate engaged therewith arises in a direction parallel to the support plane; and distal end surfaces of the burls are provided with a release structure configured so that the frictional force is less than would arise in the absence of the release structure.

In an embodiment, the release structure comprises a recess in the distal end surface of each burl. In an embodiment, the recess has an area in the range of from ¼ to ¾ of the total area of the distal end surface. In an embodiment, the recess has a depth in the range of from 10 nm to 40 nm. In an embodiment, the recess has a shape in plan selected from the group consisting of circles, squares, ovals, stars, crosses. In an embodiment, the distal end surface comprises a continuous ring surrounding the recess. In an embodiment, a part of the recess extends to a peripheral edge of the distal end surface. In an embodiment, the release structure comprises a layer of diamond-like carbon applied to the distal end surfaces of the burls. In an embodiment, the layer of diamond-like carbon has a thickness of greater than about 1 µm. In an embodiment, the layer of diamond-like carbon has a thickness of less than about 2 µm. In an embodiment, the layer of diamond-like carbon comprises at least one additive selected from the group consisting of Si, N, Mo and Fl.

In an embodiment, there is provided a lithographic apparatus for projecting an image onto a substrate, the lithographic apparatus comprising: a substrate holder as described herein; and a clamp system for clamping a substrate to the substrate holder.

In an embodiment, there is provided a lithographic apparatus comprising a substrate holder as described herein; and a clamp system configured to exert a clamping force urging the substrate toward the substrate holder, the clamping force being sufficiently strong that the substrate contacts the burl in the area of the recess when the clamping force is in effect.

In an embodiment, there is provided a method of manufacturing devices using a lithographic apparatus having a substrate holder as described herein and a clamp system for clamping a substrate to the substrate holder, the method comprising: loading a substrate onto the substrate holder; allowing a deformation of the substrate to relax; engaging the clamp system; and exposing a pattern onto the substrate. In an embodiment, the clamp system is configured to exert a clamping force urging the substrate toward the substrate holder, the clamping force being sufficiently strong that the substrate contacts the burl in the area of the recess when the clamping force is in effect.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

The descriptions above are intended to be illustrative, not limiting. Thus, it will be apparent to one skilled in the art that modifications may be made to the invention as described without departing from the scope of the claims set out below.

The invention claimed is:

1. A substrate holder for use in a lithographic apparatus and configured to support a substrate, the substrate holder comprising:
   a main body having a main body surface; and
   a plurality of burls projecting from the main body surface, wherein
      each burl has a distal end configured to engage with the substrate;
      the distal ends of the burls substantially conform to a support plane and are configured for supporting a substrate;
      a frictional force between the distal end of each burl and a substrate engaged therewith arises in a direction parallel to the support plane; and
      distal end surfaces of the burls are provided with a release structure configured so that the frictional force is less than would arise in the absence of the release structure, the release structure comprising a recess in the distal end surface of each burl, the recess comprising a main recess part and a plurality of channels which lead from the main recess part to the peripheral edge of the distal end surface, wherein the plurality of channels intersect a side wall surface of the main recess part.

2. A substrate holder according to claim 1, wherein the recess has an area in the range of from ¼ to ¾ of the total area of the distal end surface.

3. A substrate holder according to claim 1, wherein the recess has a depth in the range of from 10 nm to 40 nm.

4. A substrate holder according to claim 1, wherein the main recess part has a shape in plan selected from the group consisting of circle, square, oval, star, and cross.

5. A substrate holder according to claim 1, wherein the release structure comprises a layer of diamond-like carbon applied to the distal end surfaces of the burls.

6. A substrate holder according to claim 5, wherein the layer of diamond-like carbon has a thickness of greater than about 1 μm.

7. A substrate holder according to claim 5, wherein the layer of diamond-like carbon has a thickness of less than about 2 μm.

8. A substrate holder according to claim 5, wherein the layer of diamond-like carbon comprises at least one additive selected from the group consisting of Si, N, Mo and Fl.

9. A lithographic apparatus for projecting an image onto a substrate, the lithographic apparatus comprising:
   the substrate holder according to claim 1; and
   a clamp system configured to clamp a substrate to the substrate holder.

10. A lithographic apparatus according to claim 9, wherein the clamp system is configured to exert, in use, a clamping force urging the substrate toward the substrate holder, the clamping force being sufficiently strong that the substrate contacts the burl in the area of the main recess part when the clamping force is in effect.

11. A method of manufacturing devices using a substrate holder comprising:
   a main body having a main body surface; and
   a plurality of burls projecting from the main body surface, wherein
      each burl has a distal end configured to engage with the substrate;
      the distal ends of the burls substantially conform to a support plane and are configured for supporting a substrate;
      a frictional force between the distal end of each burl and a substrate engaged therewith arises in a direction parallel to the support plane; and
      distal end surfaces of the burls are provided with a release structure configured so that the frictional force is less than would arise in the absence of the release structure, the release structure comprising a recess in the distal end surface of each burl, the method comprising:
   loading a substrate onto the substrate holder;
   allowing a deformation of the substrate to relax;
   engaging a clamp system to clamp the substrate to the substrate holder, wherein the clamp system exerts a clamping force urging the substrate toward the substrate holder, the clamping force sufficiently strong that the substrate contacts the burl in the area of the recess when the clamping force is in effect; and
   exposing a pattern onto the substrate.

12. A method according to claim 11, wherein the release structure comprises a single recess in the distal end surface of each burl.

13. A method according to claim 11, wherein the recess has an area in the range of from ¼ to ¾ of the total area of the distal end surface.

14. A method according to claim 11, wherein a part of the recess extends to a peripheral edge of the distal end surface.

15. A method according to claim 14, wherein the recess comprises a main recess part and a plurality of channels which lead from the main recess part to the peripheral edge of the distal end surface.

16. A method according to claim 11, wherein the recess has a depth in the range of from 10 nm to 40 nm.

17. A method according to claim 11, wherein the release structure comprises a layer of diamond-like carbon applied to the distal end surfaces of the burls.

18. An object holder configured for an object processing tool and configured to support an object, the object holder comprising:
   a main body having a main body surface; and
   a plurality of burls projecting from the main body surface, wherein
      each burl has a distal end configured to engage with the object;
      the distal ends of the burls substantially conform to a support plane and are configured for supporting an object;
      a frictional force between the distal end of each burl and an object engaged therewith arises in a direction parallel to the support plane; and
      distal end surfaces of the burls are provided with a release structure configured so that the frictional force is less than would arise in the absence of the release structure, the release structure comprising a recess in the distal end surface of each burl, the recess comprising a main recess part and a plurality of channels which lead from the main recess part to the peripheral edge of the distal end surface, wherein the plurality of channels intersect a side wall surface of the main recess part.

19. The object holder of claim 18, wherein the object is a patterning device and the object processing tool is a lithographic apparatus.

20. The object holder of claim 18, wherein the object is a semiconductor substrate and the object processing tool is a metrology or inspection apparatus.

* * * * *